United States Patent
Cheng et al.

(10) Patent No.: US 9,236,447 B2
(45) Date of Patent: Jan. 12, 2016

(54) ASYMMETRIC SPACERS

(71) Applicant: International Business Machines Corporation, Armonk, NY (US)

(72) Inventors: Kangguo Cheng, Schenectady, NY (US); Ali Khakifirooz, Los Altos, CA (US); Richard S. Wise, Los Altos, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/590,238

(22) Filed: Jan. 6, 2015

(65) Prior Publication Data

US 2015/0140799 A1     May 21, 2015

Related U.S. Application Data

(62) Division of application No. 13/853,090, filed on Mar. 29, 2013, now abandoned.

(51) Int. Cl.
     *H01L 21/336*     (2006.01)
     *H01L 29/66*     (2006.01)
     *H01L 29/78*     (2006.01)
     *H01L 29/786*     (2006.01)

(52) U.S. Cl.
     CPC ...... *H01L 29/6656* (2013.01); *H01L 29/66575* (2013.01); *H01L 29/66659* (2013.01); *H01L 29/78* (2013.01); *H01L 29/785* (2013.01); *H01L 29/78606* (2013.01)

(58) Field of Classification Search
     CPC .................................................... H01L 29/00
     USPC ............ 257/288, E21.427, E21.43, E21.438, 257/E21.619, E21.634, E29.085, E29.152, 257/344; 438/286, 197

See application file for complete search history.

(56) References Cited

U.S. PATENT DOCUMENTS

| | | | |
|---|---|---|---|
| 5,741,737 A | 4/1998 | Kachelmeier | |
| 7,723,233 B2 | 5/2010 | Krull et al. | |
| 7,892,928 B2 * | 2/2011 | Cheng | H01J 37/32733 257/E29.279 |
| 8,093,658 B2 | 1/2012 | Sandhu et al. | |
| 8,202,435 B2 | 6/2012 | Tabat | |
| 8,237,136 B2 * | 8/2012 | Hautala et al. | 250/526 |
| 2003/0021908 A1 | 1/2003 | Nickel et al. | |
| 2003/0116781 A1 | 6/2003 | Ohuchi | |
| 2005/0035404 A1 | 2/2005 | Yu et al. | |
| 2005/0156268 A1 | 7/2005 | Chu | |
| 2006/0170016 A1 | 8/2006 | Mathew et al. | |
| 2006/0278611 A1 | 12/2006 | Sato et al. | |
| 2007/0145430 A1 | 6/2007 | Sandhu et al. | |

(Continued)

OTHER PUBLICATIONS

Kakuta et al., "Low Damage Smoothing of Magnetic Materials Using Off-Normal Gas Cluster Ion Beam Irradiation", Science Direct, Surface & Coatings Technology 201, pp. 8632-8636, 2007.

*Primary Examiner* — Telly Green
(74) *Attorney, Agent, or Firm* — Anthony Canale; Andrew M. Calderon; Roberts Mlotkowski Safran & Cole, P.C.

(57) ABSTRACT

A semiconductor device having asymmetric spacers and steps for forming the same are disclosed. The spacers have difference capacitances, with the spacer having a higher capacitance formed over a source region of the device and the spacer having a lower capacitance formed over a drain region of the device. Embodiments of the disclosed invention include spacers made from different materials, having different or substantially equal thicknesses.

9 Claims, 3 Drawing Sheets

(56) References Cited

U.S. PATENT DOCUMENTS

| | | | |
|---|---|---|---|
| 2008/0233691 A1* | 9/2008 | Cheng | H01J 37/32733 438/197 |
| 2009/0108347 A1 | 4/2009 | Adkisson et al. | |
| 2010/0207041 A1 | 8/2010 | Sato et al. | |
| 2011/0084215 A1* | 4/2011 | Hautala et al. | 250/396 R |
| 2012/0217587 A1 | 8/2012 | Wang | |
| 2012/0238092 A1 | 9/2012 | Russell et al. | |
| 2014/0262039 A1* | 9/2014 | Cheng | H01L 21/67069 156/345.39 |
| 2014/0291761 A1 | 10/2014 | Cheng et al. | |
| 2014/0295674 A1 | 10/2014 | Cheng et al. | |

* cited by examiner

FIG. 1A
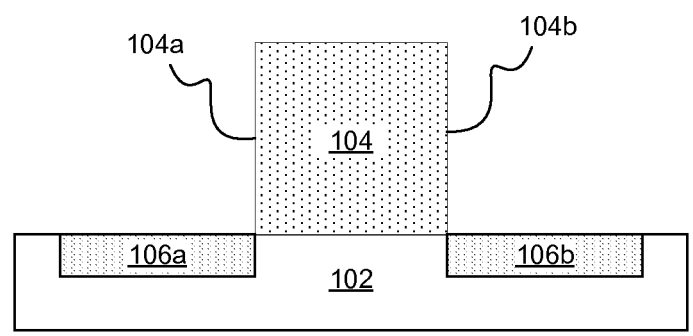
FIG. 1B
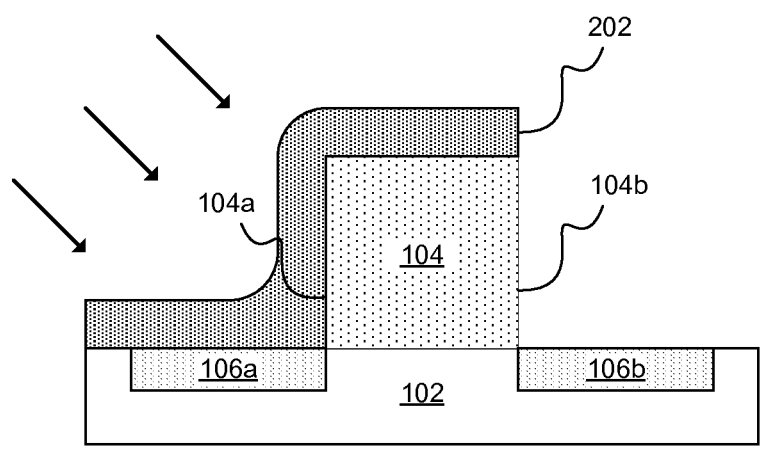
FIG. 1C

ASYMMETRIC SPACERS

PRIORITY CLAIM & CROSS REFERENCES TO RELATED APPLICATIONS

This application is a divisional of U.S. patent application Ser. No. 13/853,090, filed Mar. 29, 2013, which is hereby incorporated by reference in its entirety.

This application is related to the following commonly-owned, co-pending United States Patent Applications filed on Mar. 29, 2013, the contents and disclosure of which is expressly incorporated by reference herein in its entirety: U.S. patent application Ser. No. 13/853,088, for "ANGLED GAS CLUSTER ION BEAM".

FIELD OF THE INVENTION

The present invention generally relates to semiconductor devices, and particularly to field effect transistor devices with sidewall spacers and methods for making the same.

BACKGROUND

Complementary Metal-oxide-semiconductor (CMOS) technology is commonly used for fabricating field effect transistors (FETs) as part of advanced integrated circuits, such as CPUs, memory, storage devices, and the like. At the core of planar FETs, a channel region is formed in a n-doped or p-doped semiconductor substrate on which a gate structure is formed. The overall fabrication process is well known in the art, and includes forming a gate structure over a channel region connecting a source region and a drain region within the substrate on opposite ends of the gate, typically with some vertical overlap between the gate and the source/drain regions. In finFETs, the gate structure may be formed over or around a semiconductor fin on an insulator layer, with the source and the drain region formed on opposite ends of the semiconductor fin. In planar FETs, an insulating spacer structure is formed on opposing sidewalls of the gate over, vertically overlapping a portion of the source/drain region.

As the industry continues to move towards smaller scale devices that operate at faster speeds and with lesser operational costs, it becomes increasingly difficult to retain device operation and efficiency. This is partially because while operational side effects may be negligible at a given scale, they play a more critical role as devices are scaled down. A particular problem is the buildup of parasitic capacitance in FETs and similar structures. The source/drain regions and the gate are both conductors, and are separated by insulating spacers. Therefore, they functions as an unwanted capacitor, contributing to the buildup of parasitic capacitance. Because capacitance is inversely proportional to insulator thickness between two conductors, it increases as transistors become smaller and spaces become thinner. As the parasitic capacitance of a transistor increases, its operability and performance suffer.

Therefore, it is desirable to form a transistor structure that reduces the build up of parasitic capacitance and improves device reliability and efficiency, particularly in scaled-down transistor structures.

SUMMARY

According to an embodiment of the disclosed invention, a semiconductor device comprises a gate formed on a top surface of a substrate, the gate having a first sidewall and a second sidewall, the first sidewall positioned opposite the second sidewall, a first spacer formed on and adjacent to the first sidewall of the gate, wherein the first spacer is made of a first material, and a second spacer formed on and adjacent to the second sidewall of the gate, wherein the second spacer is made of a second material different from the first material.

According to a further embodiment of the disclosed invention, a semiconductor device includes a gate formed on a top surface of a substrate, the gate having a first sidewall and a second sidewall, the first sidewall positioned opposite the second sidewall; a first spacer formed on the gate proximate to the first sidewall, wherein the first spacer is made of a first material; and a second spacer formed on and adjacent to the second sidewall of the gate, wherein the second spacer is made of a second material different from the first material.

According to another embodiment of the disclosed invention, a method for forming a semiconductor device includes the steps of forming a gate onto a substrate, the gate having a first sidewall and a second sidewall, the first sidewall positioned opposite to the second sidewall; forming a first film layer on and adjacent to the first sidewall of the gate, wherein the first film layer is made from a first material; forming a second film layer made on and adjacent to the second sidewall of the gate, wherein the second film layer is made from a second material different from the first material; and shaping the first film layer to form a first spacer and shaping the second film layer to form a second spacer.

According to a further embodiment of the disclosed invention, a method for forming a semiconductor device, includes forming a gate onto a substrate, the gate having a first sidewall and a second sidewall, the first sidewall positioned opposite to the second sidewall; forming a first film layer on the gate proximate to the first sidewall, wherein the first film layer is made from a first material; forming a second film layer made on and adjacent to the second sidewall of the gate, wherein the second film layer is made from a second material different from the first material; and shaping the first film layer to form a first spacer and shaping the second film layer to form a second spacer.

BRIEF DESCRIPTION OF THE DRAWINGS

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

FIG. 1A is a cross sectional front elevational view of a substrate layer formed during a step of a method for fabricating a FET device, according to an embodiment of the present invention;

FIG. 1B is a cross sectional front elevational view of a gate layer and a source/drain region formed onto the substrate layer depicted in FIG. 1A, according to an embodiment of the present invention;

FIG. 1C is a cross sectional front elevational view of a nitride spacer film layer formed onto the structure depicted in FIG. 1B, according to an embodiment of the present invention;

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1D:
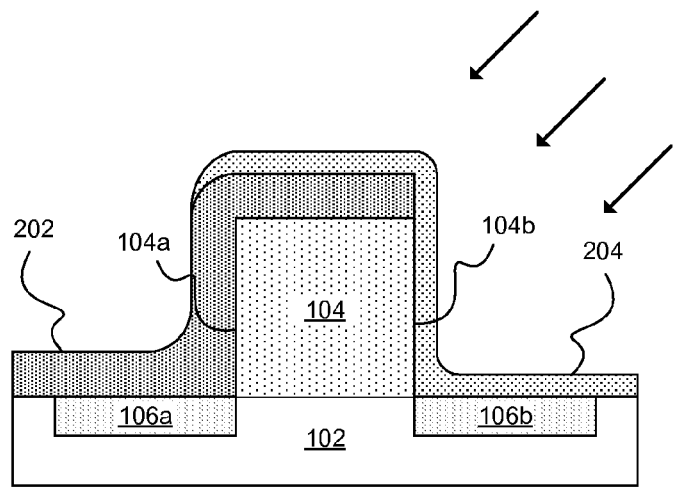
FIG. 1D is a cross sectional front elevational view of an oxide spacer film layer formed onto the structure depicted in FIG. 1C, according to an embodiment of the present invention.

Referring to FIGS. 1A-F, an exemplary embodiment of the disclosed invention is shown and discussed hereinafter. FIG. 1A depicts a base substrate layer 102. Although only one substrate layer is shown, embodiments of the disclosed invention may comprise multi-layered substrates, including a buried oxide (BOX) layer (not shown), or a semiconductor-on-insulator (SOI) layer (not shown). The base substrate layer 102 may be made of any semiconductor material including, without limitation: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. A BOX layer (not shown) may be formed from any of several dielectric materials. Non-limiting examples include: oxides, nitrides, and oxynitrides of silicon, and combinations thereof. Oxides, nitrides, and oxynitrides of other elements are also envisioned. Further, the BOX layer (not shown) may include crystalline or non-crystalline dielectric material. The BOX layer (not shown) may be approximately 5 to approximately 500 nm thick, preferably approximately 200 nm. A SOI layer (not shown) may be made of any of the several semiconductor materials possible for base substrate layer 102. In general, the base substrate layer 102 and the SOI layer (not shown) may include either identical or different semiconducting materials with respect to chemical composition, dopant concentration and crystallographic orientation. The SOI layer (not shown) may be p-doped or n-doped with a dopant concentration of approximately $1\times10^{15}$ to approximately $1\times10^{18}/cm^3$, preferably approximately $1\times10^{15}/cm^3$. The SOI layer (not shown) may be approximately 2 to approximately 300 nm thick, preferably approximately 5 to approximately 100 nm.

Referring now to FIG. 1B, a gate 104 is formed over a central portion of the base substrate layer 102, and has a first sidewall 104a and an opposing sidewall 104b. The gate 104 may include a gate electrode, a gate dielectric, and a gate hard mask (not shown), made of, for example, a nitride material, and may be approximately 20 nm to approximately 150 nm thick, preferably approximately 50 nm. In some embodiments, the gate 104 may be formed using a gate-first process, in which case the gate electrode may further include a set of work-function metal layers, and a metal fill layer. The gate dielectric layer may be made of metal oxides, metal silicates, metal nitrides, transition metal oxides, transition metal silicates, transition metal nitrides, or combinations thereof, and may be approximately 1 nm to approximately 5 nm thick. Exemplary gate dielectric layer materials include silicon dioxide, hafnium oxide, and aluminum oxide. The work-function metal layers may include multiple metal-containing layers and may be made of titanium nitride, tantalum nitride, or titanium-aluminum and may be approximately 20 to approximately 100 angstroms thick. The metal fill layer may be made of, for example, silicon, aluminum, copper, tungsten, or some combination thereof. Other embodiments may include more or less metal layers depending on the application and the types of devices being formed. The composition of each metal layer may also vary and the process of selecting the material for each metal layer is known in the art.

In other embodiments, the gate 104 may be formed using a gate-last process, in which case the gate 104 may include a dummy gate layer made of, for example, silicon, and a dummy gate dielectric made of, for example, silicon oxide, intended to serve as a placeholder for the replacement gate formed after later processing steps. The gate 104 is replaced with a true gate dielectric and a gate conductor during subsequent processes.

Further referring to FIG. 1B, a source region 106a and a drain region 106b is formed on opposing sides of the gate 104 onto the substrate layer 102, using any known method in the art, including, for example, ion implantation, gas phase doping, plasma doping, recess and in-situ doped epitaxy growth. It is not essential to the practice of the disclosed invention to form the source/drain regions 106a and 106b, although this step is typically performed in existing fabrication processes. Nor is it necessary to form the source/drain regions 106a and 106b in the depicted shape, length, width, height, or positions. Moreover, it is not necessary for these regions to be formed before sidewall spacers are formed. Additionally, while each of these two regions is referred to as either a source or a drain region for ease of reference, other embodiments of the disclosed invention may have the source region formed on the area denoted by 106b, and the drain region formed in the area denoted by 106a.

Referring now to FIG. 1C, a first spacer film layer 202 is formed onto a top surface of the gate 104 and adjacent to the first sidewall 104a of the gate 104 and the substrate layer 102 where the source region 106a is formed. The spacer film layer 202 may be formed using any known method in the art, such as masked deposition or etching, so that is formed only on one side of the gate 104. In a related embodiment, the spacer film layer 202 may be formed on the top side and adjacent to the first sidewall 104a and the second sidewall 104b of the gate 104, and thereafter selectively removed by any known means in the art, so that the spacer film layer 202 is removed from the second sidewall 104b of the gate 104.

Further referring to FIG. 1C, an additional method for forming the spacer film layer 202 onto the source region 106a side of the gate 104 includes angled gas cluster ion beam ("angled GCIB") deposition, as described in the co-pending U.S. patent application Ser. No. 13/853,088 incorporated herein by reference.

Referring now to FIG. 1D, a second spacer film layer 204 is formed onto the top side and adjacent to the second sidewall 104b of the transistor structure comprising the substrate layer 102, the gate 104, and the deposited spacer film layer 202. In a related embodiment, the spacer film layer 204 may be formed adjacent to the first sidewall 104a, the second sidewall 104b, and the top side of the gate 104, and thereafter selectively removed by any known means so that the spacer film layer 204 is removed from at least the first sidewall 104a of the gate 104. One process that may be used to selectively deposit the spacer film layer 204 is angled GCIB deposition, as described above.

Although the spacer film layer 202 forms a thicker layer than the spacer film layer 204 in the depicted embodiment, the spacer film layer 202 may in fact be the thinner layer of the two in other embodiments. In other words, it is not necessary that the thicker layer of the two spacer film layers be formed first.

Figure 1E:
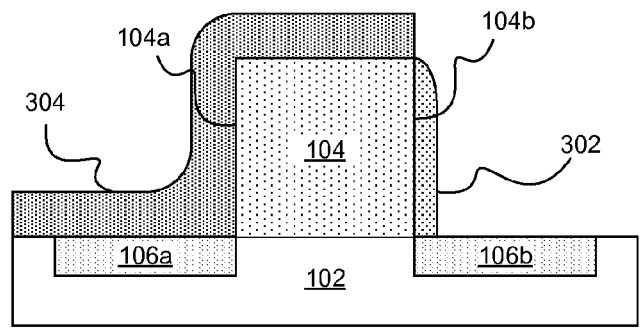
FIG. 1E is a cross sectional front elevational view of an oxide spacer formed onto the structure depicted in FIG. 1D, according to an embodiment of the present invention.

Referring now to FIG. 1E, the spacer film layer 204 is removed by any known method in the art, such as reactive ion etching (RIE) or GCIB etching (as described in the co-pending U.S. patent application Ser. No. 13/853,090), to form a first spacer 302 on the second side of the gate 104.

Figure 1F:
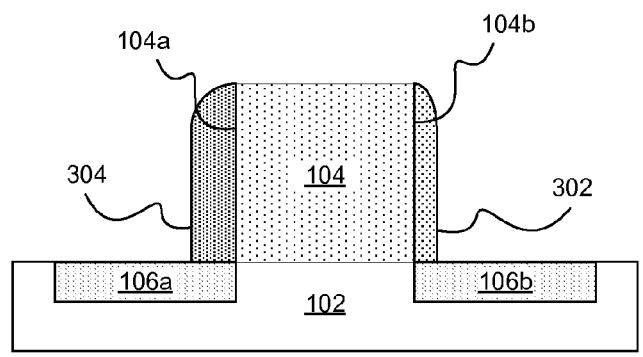
FIG. 1F is a cross sectional front elevational view of a nitride spacer formed onto the structure depicted in FIG. 1E, having a relatively higher thickness than the oxide spacer depicted in FIG. 1E, according to an embodiment of the present invention.

Referring now to FIG. 1F, the spacer film layer 202 is also removed by any known method in the art, as described above, to form a second spacer 304 on the first side of the gate 104.

The resulting structure shown in FIG. 1F comprises the substrate layer 102, the gate layer 104, the source region 106a and the drain region 106b, and the spacers 302 and 304. According to the disclosed embodiment, the spacers 302 and 304 are formed using different materials, and have different thicknesses. Consequently, each spacer possesses a different dielectric capacitance that is, in part, a function of its material (having a distinct dielectric constant) and thickness. The spacer 304 is formed using an oxide compound and is thicker than the spacer 302, which is formed using a nitride compound. Preferably, the oxide spacer 304 has a thickness of 10 nm, and the nitride spacer 302 has a thickness of 5 nm. Generally, nitride compounds have a higher dielectric constant than oxide compounds. Additionally, since the capacitance of each resulting structure is inversely proportional to the dielectric thickness of the structure, the thicker oxide spacer 304 has a lower capacitance than the thinner nitride spacer 302. The oxide spacer 304 is formed on the drain side of the gate 104, and the nitride spacer 302 is formed on the source side of the gate 104.

Further referring to FIG. 1F, according to an aspect of the invention, the second spacer 304 may be deposited onto the top surface of the gate 104 and adjacent to the first sidewall 104a, such that the interface between the spacer 304 and the sidewall 104a does not include the material used to form the spacer 302. Likewise, the spacer 302 may be deposited onto the top surface of the gate 104 and adjacent to the second sidewall 104b, such that the interface between the spacer 302 and the sidewall 104b does not include the material used to form the spacer 304. Each of the two spacers 304 and 302 is in contact with, and is said to be adjacent to the sidewalls 104a and 104b, respectively.

According to another embodiment of the disclosed invention, one or more intermediary layers may be formed at the interface of one of the spacer 302 or 304 and the respective sidewalls 104b or 104a, prior to the formation of that spacer film layer. For example, an oxide layer may be formed onto the gate 104 and adjacent to the sidewall 104a, and thereafter the spacer 304 may be formed on top of the oxide layer, proximate to the sidewall 104a. According to the disclosed embodiment, the spacer 302 may be formed on the gate and adjacent to the sidewall 104b.

In a related embodiment, the spacer 304 may be formed using an oxide compound (having, for example, a relative dielectric constant dielectric constant of 3.9), and the spacer 302 may be formed using a second compound having a lower dielectric constant, such as carbon doped-silicon oxide.

Figure 2A:
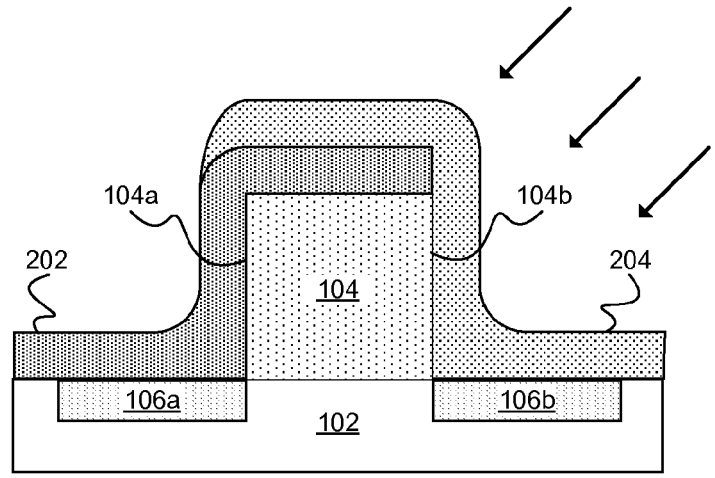
FIG. 2A is a cross sectional front elevational view of an oxide spacer film layer formed onto a nitride film layer formed over an FET gate structure, according to an embodiment of the present invention.
Figure 2B:
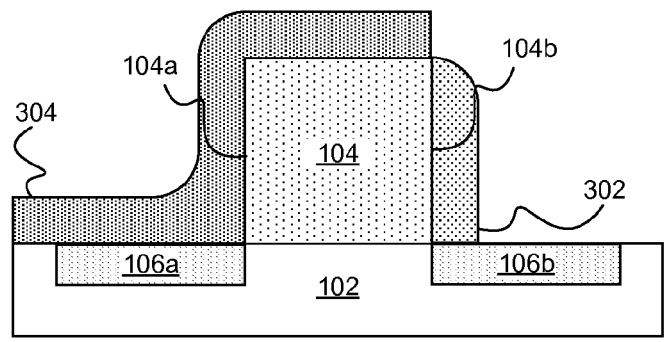
FIG. 2B is a cross sectional front elevational view of an oxide spacer formed onto the structure depicted in FIG. 2A, according to an embodiment of the present invention.
Figure 2C:
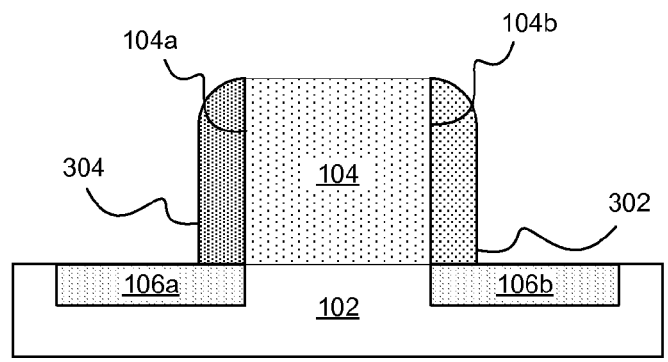
FIG. 2C is a cross sectional front elevational view of a nitride spacer formed onto the structure depicted in FIG. 2B, having a substantially equal thickness relative to the oxide spacer depicted in FIG. 2B, according to an embodiment of the present invention.

Referring now generally to FIGS. 2A-C, a further embodiment of the disclosed invention includes the steps of forming a substrate layer 102, a gate 104 having a first sidewall 104a and a second sidewall 104b, a source region 106a and a drain region 106b, and a first spacer film layer 202 onto a sidewall of the gate 104 and onto the substrate layer 102, including the source region 106a, in the same manner as described above and depicted in FIGS. 1A-1C (the steps depicted in FIGS. 1A-1C are not duplicated in FIGS. 2A-2C).

Referring now specifically to FIG. 2A, a second spacer film layer 204 is formed onto the top surface and adjacent to the second sidewall 104b of the gate 104 and over the substrate layer 102 where the drain region 106b is formed, using any known method in the art, including angled GCIB deposition, so that sufficient film material exists to allow the formation of spacers of substantially equal thickness in subsequent steps of the fabrication process.

Referring now to FIG. 2B, the spacer film layer 204 is removed by any known method in the art so as to form a first spacer 302. Among the methods that may be used to form the spacer 302 is angled GCIB etching, as described in the co-pending U.S. patent application Ser. No. 13/853,090.

Referring now to FIG. 2C, the spacer film layer 202 is also removed by any known method in the art so as to form a second spacer 304. The resulting structure comprises the substrate 102, the gate 104, the source region 106a and the drain region 106b, and the spacers 302 and 304. The spacers 302 and 304 are of substantially equal shape and thickness, but are made from different materials.

As described in connection with FIGS. 1A-F, according to the disclosed embodiment, the interface between the spacer 304 and the sidewall 104a does not include the material used to form the spacer 302. Likewise, the interface between the spacer 302 and the sidewall 104b does not include the material used to make the spacer 304. Each spacer is adjacent to the gate 104 via its respective sidewalls 104a and 104b.

According to a related embodiment, the spacer 304 may be formed proximate to the sidewall 104a subsequent to forming an underlying layer using a material such as an oxide, and the spacer 302 may be formed adjacent to the sidewall 10b.

According to the disclosed embodiment, the spacer 302 is made from an oxide compound having a lower dielectric constant relative to the spacer 304, and is formed over the drain side of the gate, whereas the spacer 304 is made from a nitride compound having a relatively higher dielectric constant and is formed over the source side of the gate.

According to a related embodiment, the spacer 304 is made from an oxide compound (having, for example, a relative dielectric constant of 3.9), and the spacer 302 is made from a material having a lower dielectric constant, such as carbon-doped silicon oxide.

Other embodiments of the disclosed invention may use one or more other materials exclusively or in addition to those recited above, including, and without limitation, oxynitrides, and doped materials, such as carbon-doped oxides, nitrides, and oxynitrides, as well as boron-doped nitrides, oxides, and oxynitrides.

Each embodiment of the disclosed invention is advantageous relative to the prior art because it exhibits a higher dielectric constant on its source side, leading to better drive current; and a lower dielectric constant on its drain side, leading to decreased parasitic capacitance and lower power consumption. Each embodiment further allows for additional space in the trench structures formed between serially positioned transistors by using less spacer material on one or both sides of the gate 104. The additional space can be used to form more reliable contacts during subsequent fabrication steps. This benefit becomes more critical as transistors are scaled down even further, limiting the space available for forming effective and reliable contact regions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

We claim:

1. A method for reducing parasitic capacitance in semiconductor device, comprising:
   forming a gate onto a substrate, the gate having a first sidewall and a second sidewall, the first sidewall positioned opposite to the second sidewall;
   depositing a first film layer directly in contact with a drain region and on and adjacent to the first sidewall of the gate and a top surface thereof using a first material having a first dielectric constant;
   depositing a second film layer directly in contact with a source region and on and adjacent to the second sidewall of the gate and on the first film layer of a topside of the gate using a second material different from the first material and having a second dielectric constant higher than the first dielectric constant; and
   shaping the first film layer to form a first spacer and shaping the second film layer to form a second spacer, wherein the shaping of the first film layer and the shaping of the second film layer includes removing the second material from the first material followed by removing the first material from the top surface of the gate, whereby the first spacer has a higher capacitance than a capacitance of the second spacer, wherein one or more of the steps of depositing and shaping are performed using an angled gas cluster ion beam (GCIB) device.

2. The method of claim 1, wherein:
   the first spacer is formed above the source region;
   the second spacer is formed above the drain region;
   the first spacer is thicker than the second spacer; and
   the first spacer is made from a nitride and the second spacer is made from an oxide.

3. The method of claim 1, wherein the first material and/or the second material are selected from the group consisting of oxides, nitrides, oxynitrides, carbon-doped oxides, carbon-doped nitrides, carbon-doped oxynitrides, and boron-doped oxynitrides.

4. The method of claim 1, further comprising:
   selecting for use as the first material, a nitride; and
   selecting for use as the second material, an oxide.

5. The method of claim 4, wherein:
   selecting for use as the first material comprises selecting a first oxide; and
   selecting for use as the second material comprises selecting a second oxide having a lower dielectric constant than the first oxide.

6. The method of claim 1, wherein shaping the first and second film layers further comprises:
   shaping the first spacer to have a greater thickness than the second spacer.

7. The method of claim 6, wherein the first spacer is formed at a thickness of approximately 10 nanometers and the second spacer is formed at a thickness of approximately 5 nanometers.

8. The method of claim 1, wherein depositing one or more of the first and second film layers comprises:
   positioning the semiconductor device at an angle relative to an emission point of the GCIB device; and
   angularly depositing the first or second film layer on the semiconductor device using the GCIB device.

9. The method of claim 1, wherein shaping the first and or the second film layers comprises:
   positioning the semiconductor device at an angle relative to an emission point of the GCIB device; and
   angularly removing portions of the first or second film layer on the semiconductor device using the GCIB device.

* * * * *